US012796370B2

(12) United States Patent
Fujita et al.

(10) Patent No.: US 12,796,370 B2
(45) Date of Patent: Nov. 10, 2026

(54) GALLIUM OXIDE SUBSTRATE DIVISION METHOD

(71) Applicant: TDK Corporation, Tokyo (JP)

(72) Inventors: Minoru Fujita, Tokyo (JP); Jun Arima, Tokyo (JP); Katsumi Kawasaki, Tokyo (JP); Jun Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 491 days.

(21) Appl. No.: 18/549,255

(22) PCT Filed: Feb. 24, 2022

(86) PCT No.: PCT/JP2022/007590
§ 371 (c)(1),
(2) Date: Sep. 6, 2023

(87) PCT Pub. No.: WO2022/202074
PCT Pub. Date: Sep. 29, 2022

(65) Prior Publication Data

US 2024/0170335 A1 May 23, 2024

(30) Foreign Application Priority Data

Mar. 24, 2021 (JP) ................................ 2021-050286

(51) Int. Cl.
*H10P 54/00* (2026.01)

(52) U.S. Cl.
CPC .................................. *H10P 54/00* (2026.01)

(58) Field of Classification Search
CPC ........ H01L 21/78; B28D 5/0011; H10P 54/00
See application file for complete search history.

(56) References Cited

U.S. PATENT DOCUMENTS

2007/0134833 A1* 6/2007 Ikemoto ................ H10H 20/01 438/33
2020/0312717 A1* 10/2020 Priewasser ............. H01L 21/78

FOREIGN PATENT DOCUMENTS

JP 06-11071 B2 2/1994
JP 07-201783 A 8/1995

OTHER PUBLICATIONS

International Search Report issued in corresponding International Patent Application No. PCT/JP2022/007590, dated Apr. 26, 2022, with English translation.

* cited by examiner

*Primary Examiner* — Thanh T Nguyen
(74) *Attorney, Agent, or Firm* — Rimon P.C.

(57) ABSTRACT

To divide a β-type gallium oxide substrate having a (001) plane as a main surface satisfactorily. A method of diving a gallium oxide substrate includes: a step of forming a plurality of dividing grooves along the extending direction of the (100) plane of a β-type gallium oxide substrate having the (001) plane as the main surface; a step of processing the β-type gallium oxide substrate into strips by cutting the substrate in a direction perpendicular to the extending direction of the dividing grooves; and a step of cleaving the strip-shaped β-type gallium oxide substrates 10 along the dividing grooves for singulation. Since the plurality of dividing grooves are thus formed along the cleavage planes, the substrate can be divided satisfactorily without causing flaky peeling on the cleavage surfaces by cleaving the substrate along the dividing grooves.

10 Claims, 5 Drawing Sheets

GALLIUM OXIDE SUBSTRATE DIVISION METHOD

CROSS REFERENCE TO RELATED APPLICATIONS

This application is the U.S. National Phase under 35 U.S.C. § 371 of International Application No. PCT/JP2022/007590, filed on Feb. 24, 2022, which claims the benefit of Japanese Patent Application No. 2021-050286, filed on Mar. 24, 2021, the entire contents of each are hereby incorporated by reference.

TECHNICAL FIELD

The present invention relates to a method of dividing a gallium oxide substrate and, more particularly, to a method of dividing a β-type gallium oxide substrate.

BACKGROUND ART

The methods described in Patent Documents 1 and 2 are known as methods of dividing a compound semiconductor. The method disclosed in Patent Document 1 includes forming a scratch having a length of 150 μm to 200 μm on the main surface of a substrate using a scriber, then processing the substrate into strips by dicing, and subsequently cleaving the strip-shaped substrates along the scratches for singulation. The method disclosed in Patent Document 2 includes forming cut grooves and scribe lines on both sides of a substrate and cleaving the substrate along the cut grooves and scribe lines for singulation.

CITATION LIST

Patent Document

[Patent Document 1] JP 07-201783A
[Patent Document 2] Japanese Examined Patent Application Publication No. 06-011071

DISCLOSURE OF THE INVENTION

Problem to be Solved by the Invention

However, since the (100) plane of a β-type gallium oxide substrate is highly cleaved, the method described in Patent Document 1 has the problem that flaky delamination occurs on a cleavage surface in the areas where no scratches are formed. In addition, in the β-type gallium oxide substrate having the (001) plane as the main surface, the (100) plane, which is a cleavage surface, is not perpendicular to the main surface but has a predetermined inclination, so that the method described in Patent Document 2 cannot cleave the β-type gallium oxide substrate correctly.

A method of simply dicing the β-type gallium oxide substrate into a matrix may also be considered; however, as described above, the (100) plane, which is the cleavage surface, is not perpendicular to the main surface, so that when dicing is performed along the extending direction of the cleavage surface, chipping occurs due to partial cleavage.

It is therefore an object of the present invention to provide a method of satisfactorily dividing a β-type gallium oxide substrate having a (001) plane as a main surface.

Means for Solving the Problem

A method of dividing a β-type gallium oxide substrate according to the present invention includes; a step of forming a plurality of first dividing grooves along the extending direction of the (100) plane of a β-type gallium oxide substrate having a (001) plane as a main surface: a step of processing the β-type gallium oxide substrate into strips by cutting the β-type gallium oxide substrate in a direction perpendicular to the extending direction of the first dividing grooves; and a step of cleaving the strip-shaped β-type gallium oxide substrates along the first dividing grooves for singulation.

According to the present invention, since the plurality of first dividing grooves are thus formed along the cleavage planes, the substrate can be divided satisfactorily without causing flaky peeling on the cleavage surfaces by cleaving the substrate along the first dividing grooves.

In the present invention, the first dividing grooves may be formed by etching. This prevents the substrate from being cracked or chipped at the time of forming the first dividing grooves.

In the present invention, the first dividing grooves may be formed on the back surface located on the side opposite to an element forming surface. This eliminates the need to process the element forming surface.

Further, the method for dividing a β-type gallium oxide substrate according to the present invention may further include a step of forming a plurality of second dividing grooves in the element forming surface along the extending direction of the (100) plane, and a straight line connecting the first and second dividing grooves may have an angle of about 76° with respect to the element forming surface. Thus, since the first and second dividing grooves are positioned on the same cleavage surface, singulation by cleavage can be performed more reliably.

Advantageous Effects of the Invention

As described above, according to the present invention, it is possible to satisfactorily divide a β-type gallium oxide substrate having a (001) plane as a main surface.

BRIEF DESCRIPTION OF THE DRAWINGS

FIG. 1 is a schematic view for explaining a method of dividing a β-type gallium oxide substrate according to a first embodiment of the present invention, where

FIG. 5 is a schematic view for explaining a method of dividing a β-type gallium oxide substrate according to a second embodiment of the present invention, where

MODE FOR CARRYING OUT THE INVENTION

Hereinafter, preferred embodiments of the present invention will be described in detail with reference to the accompanying drawings.

Figure 1A:
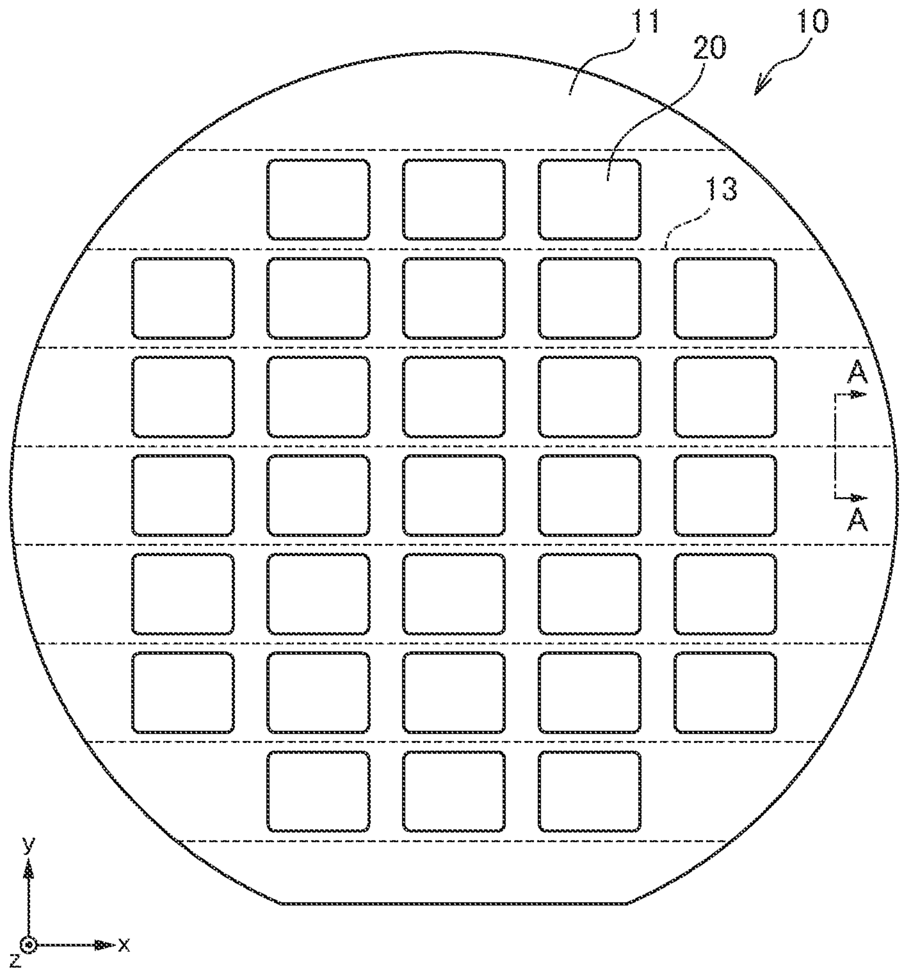
FIG. 1A is a plan view.
Figure 1B:
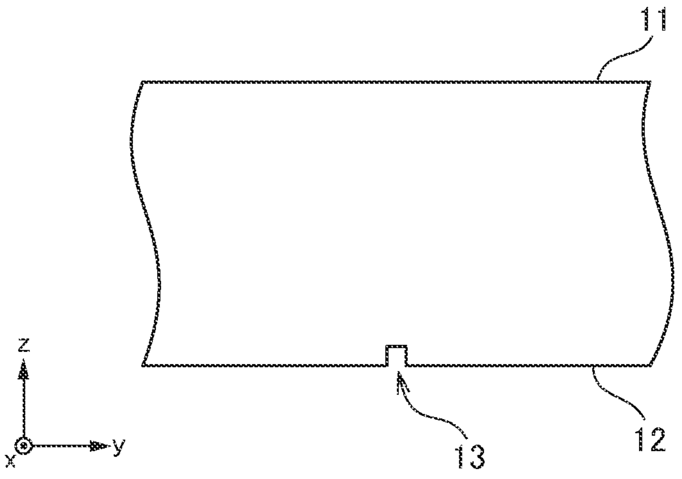
FIG. 1B is a schematic cross-sectional view taken along the line A-A in FIG. 1A.
Figure 2:
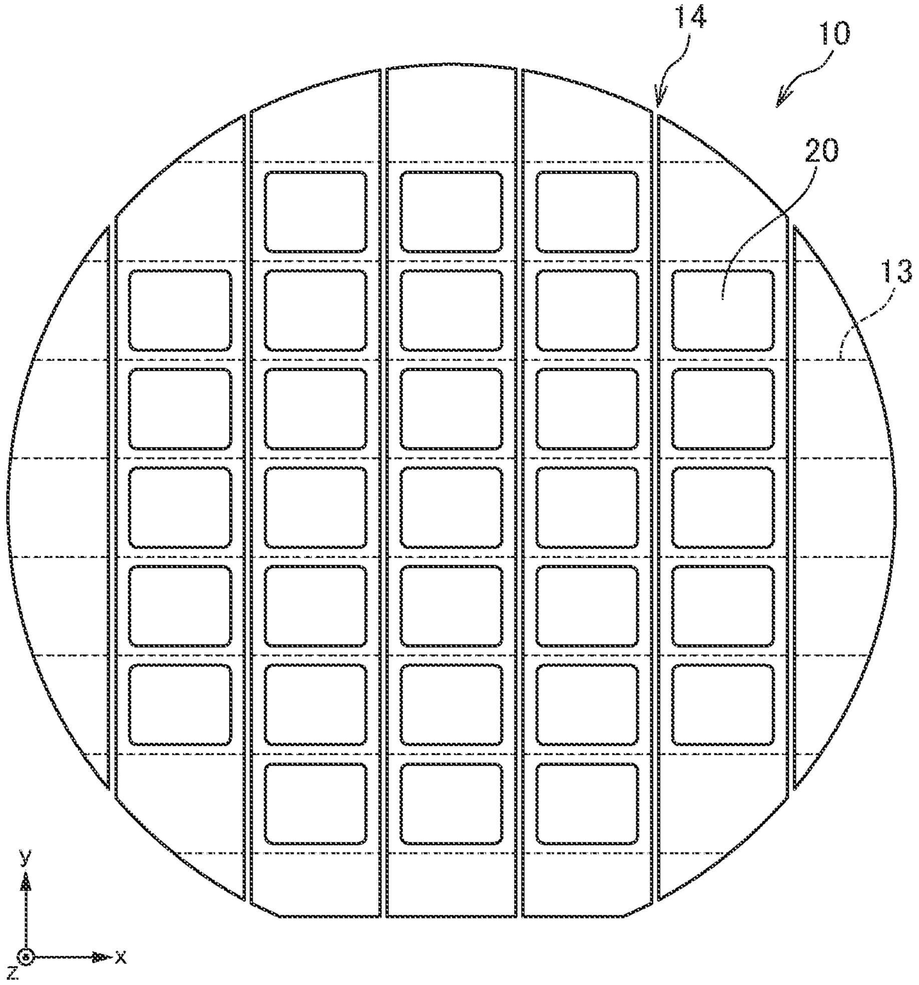
FIG. 2 is a schematic plan view for explaining a method of dividing a β-type gallium oxide substrate according to the first embodiment of the present invention.
Figure 3:
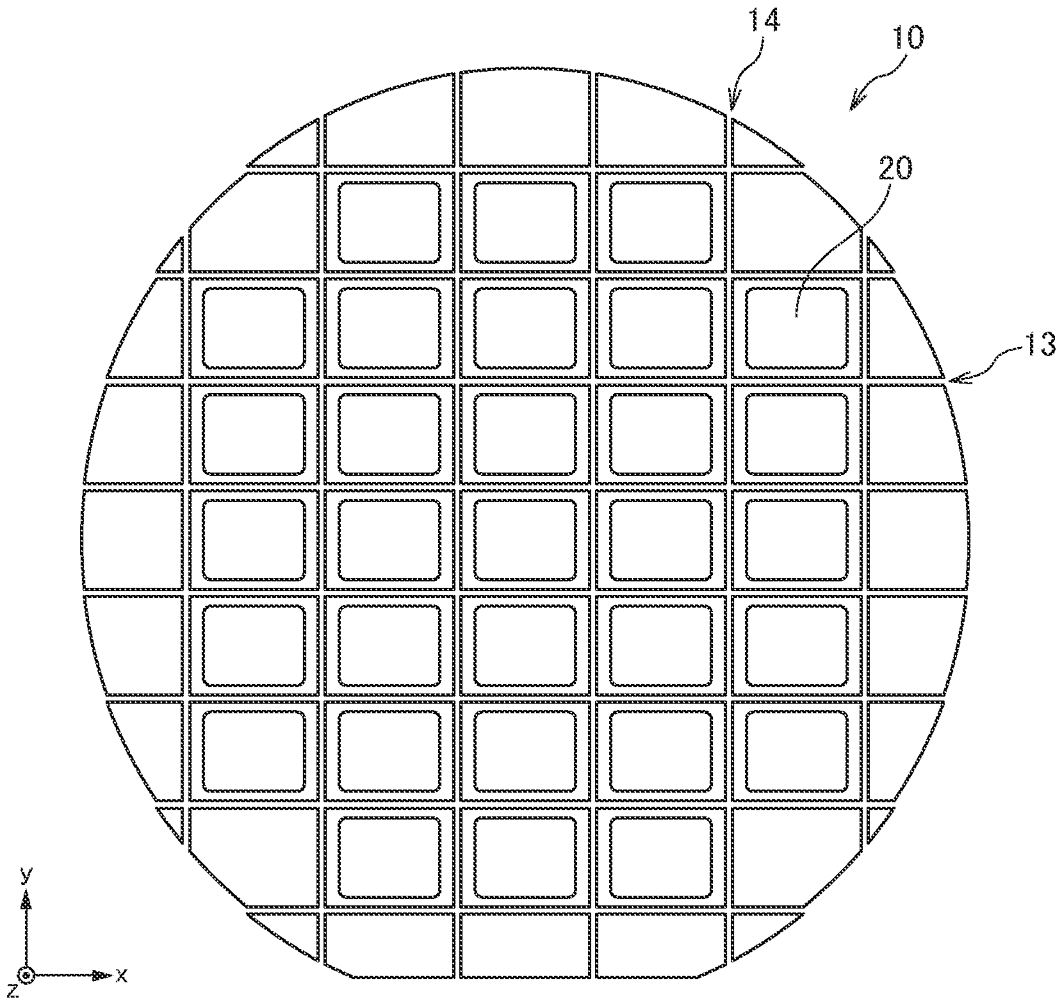
FIG. 3 is a schematic plan view for explaining a method of dividing a β-type gallium oxide substrate according to the first embodiment of the present invention.

FIGS. 1 to 3 are schematic views for explaining a method of dividing a β-type gallium oxide substrate according to a first embodiment of the present invention. FIGS. 1A, 2 and 3 are plan views, and FIG. 1B is a schematic cross-sectional view taken along the line A-A in FIG. 1A.

As illustrated in FIG. 1, a β-type gallium oxide ($Ga_2O_3$) substrate 10 having a plurality of elements 20 formed on an element forming surface 11, which is the main surface, is prepared. Although not particularly limited, the element 20 may be a Schottky barrier diode. A Schottky barrier diode using a β-type gallium oxide substrate is an element in which current flows in the substrate thickness direction, and the side on which a drift layer and an anode electrode brought into Schottky-contact with the drift layer are formed is the element forming surface. Gallium oxide has a very large bandgap of 4.8 eV to 4.9 eV and a high dielectric breakdown field of approximately 8 MV/cm, and thus the Schottky barrier diode using gallium oxide is very promising as a switching element for power devices.

The element forming surface 11 and a back surface 12 located on the opposite side of the element forming surface 11 constitute a (001) plane (c-plane). In FIG. 1, the (001) plane constitutes the xy plane, and a plurality of elements 20 are formed in a matrix in the x and y directions. A plurality of dividing grooves 13 extending in the x-direction are formed in the back surface 12 of the thus configured β-type gallium oxide substrate 10 so as to pass between the elements 20 adjacent in the y-direction. The x-direction is the extending direction of the (100) plane (a plane), which is the cleavage surface. Etching is preferably used as a method of forming the dividing grooves 13. When the dividing grooves 13 are formed by etching, the β-type gallium oxide substrate 10 is not cracked or chipped at the time of forming the dividing grooves 13. The depth of the dividing grooves 13 may be about 25 μm when the thickness of the β-type gallium oxide substrate 10 is about 250 μm. The dividing grooves 13 are not formed partially, but are formed over the entire width of the β-type gallium oxide substrate 10 in the x-direction.

Then, as illustrated in FIG. 2, the β-type gallium oxide substrate 10 is processed into strips by cutting the β-type gallium oxide substrate 10 along dicing lines 14 extending in the y-direction. That is, the cutting direction is a direction perpendicular to the extending direction of the dividing grooves 13. The cutting position is between the elements 20 adjacent in the x direction. As a result, each of the β-type gallium oxide substrates 10 cut into strips has a plurality of elements 20 arranged in the y-direction, and the dividing grooves 13 are formed on the back surface 12 between the elements 20 adjacent to each other in the y-direction.

Figure 4:
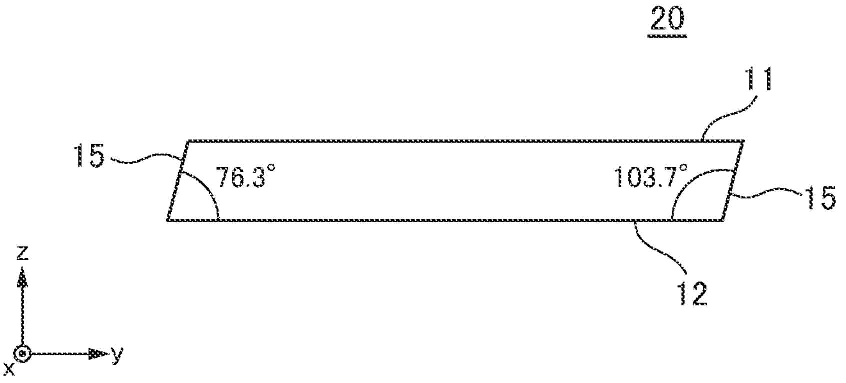
FIG. 4 is a yz cross section of the singulated element 20.

Then, as illustrated in FIG. 3, the strip-shaped β-type gallium oxide substrate 10 is cleaved along the dividing grooves 13 to singulate the elements 20. FIG. 4 is a yz cross section of the singulated element 20, and the cleavage surface 15 cleaved along the dividing groove 13 has an angle of about 76° (exactly 76.3°) and about 104° (precisely 103.7°) with respect to the element forming surface 11 and the back surface 12.

As described above, according to the method of dividing a β-type gallium oxide substrate according to the present embodiment, the plurality of dividing grooves 13 are formed along the extending direction of the (100) plane, which is the cleavage surface, so that cleavage along the makes a dividing grooves 13 it possible to obtain substantially flat cleavage surface 15 without causing flaky peeling or the like. In addition, unlike the simple matrix dicing of the β-type gallium oxide substrate 10, chipping does not occur, and the cutting margin associated with dicing can be reduced, so that the number of chips that can be obtained increases. Moreover, the dividing grooves 13 are formed on the back surface 12 opposite to the element forming surface 11, so that the element forming surface 11 need not be processed. However, in the present invention, forming the dividing grooves 13 on the back surface 12 is not essential, and the dividing grooves 13 may be formed on the element forming surface 11.

Figure 5A:
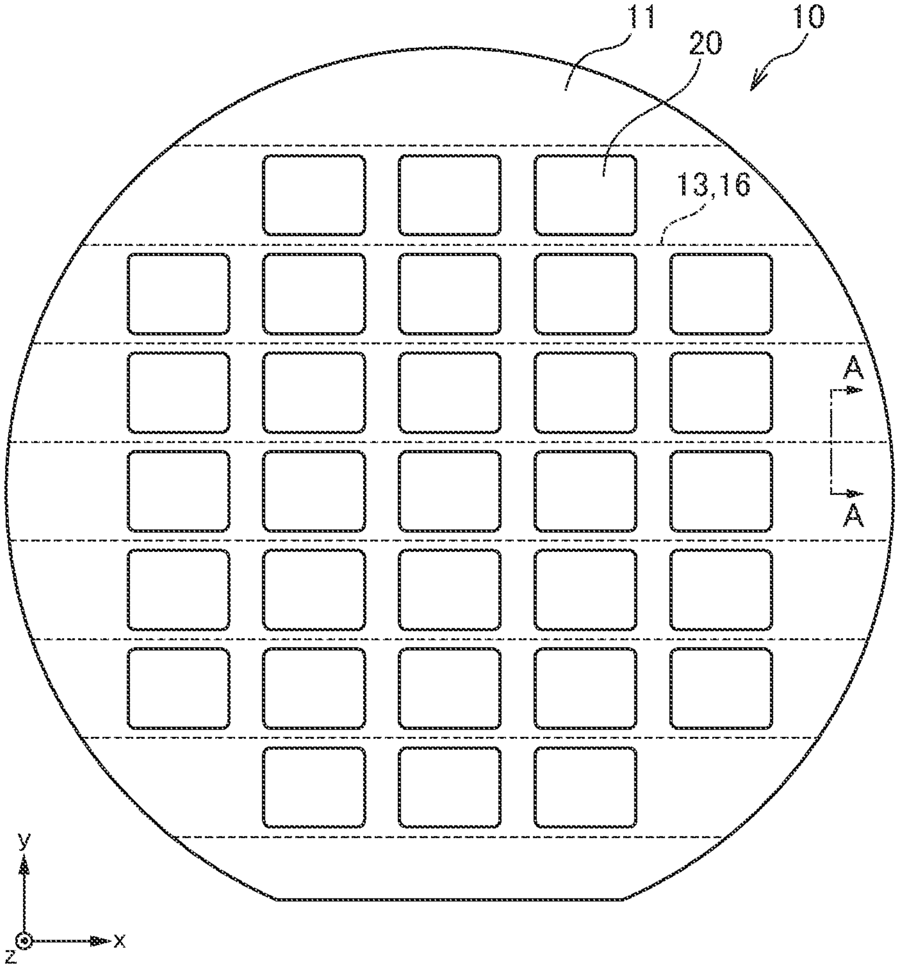
FIG. 5A is a plan view.
Figure 5B:
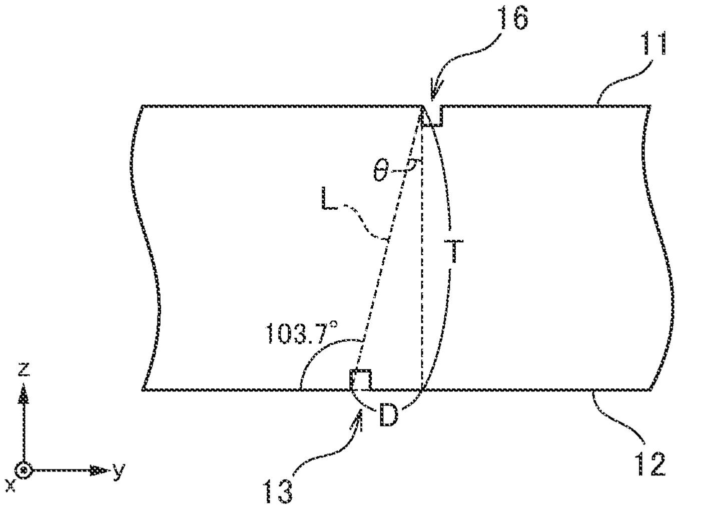
FIG. 5B is a schematic cross-sectional view taken along line A-A in FIG. 5A.

FIG. 5 is a schematic view for explaining a method of dividing a β-type gallium oxide substrate according to a second embodiment of the present invention. Here, FIG. 5A is a plan view, and FIG. 5B is a schematic cross-sectional view taken along line A-A in FIG. 5A.

The second embodiment differs from the first embodiment in that dividing grooves 16 are additionally formed in the element forming surface 11. The dividing grooves 16 extend parallel to the dividing grooves 13. However, the dividing grooves 13 and 16 do not overlap in the thickness direction (z-direction) and are offset by a distance D in the y-direction. The distance D is found by T×tan θ (θ=13.7°), where T is the thickness of the β-type gallium oxide substrate 10. Here, a straight line L connecting the dividing grooves 13 and 16 has angles of about 76° and about 104° with respect to the element forming surface 11 and the back surface 12, respectively. That is, the dividing grooves 13 and 16 are positioned on the same cleavage surface.

Thus, when the β-type gallium oxide substrate 10 is cut into strips and then cleaved along the dividing grooves 13 and 16, singulation by cleavage can be performed more reliably.

A drift layer in which an element is formed is a thin film obtained by epitaxially growing gallium oxide on the upper surface of a β-type gallium oxide substrate using reactive sputtering, PLD, MBE, MOCVD, HVPE, or the like. When a thin film is epitaxially grown on the upper surface of a β-type gallium oxide substrate using the HVPE method, it will generally be grown on the (001) plane. However, in the case of a β-type gallium oxide substrate whose surface is the (001) plane, there may be an offset angle of about +1° with respect to the x- and y-axes due to manufacturing variations. Furthermore, in consideration of ease of epitaxial growth and deposition properties, the thin film may be grown on a β-type gallium oxide substrate having an offset angle of several degrees.

Figure 6:
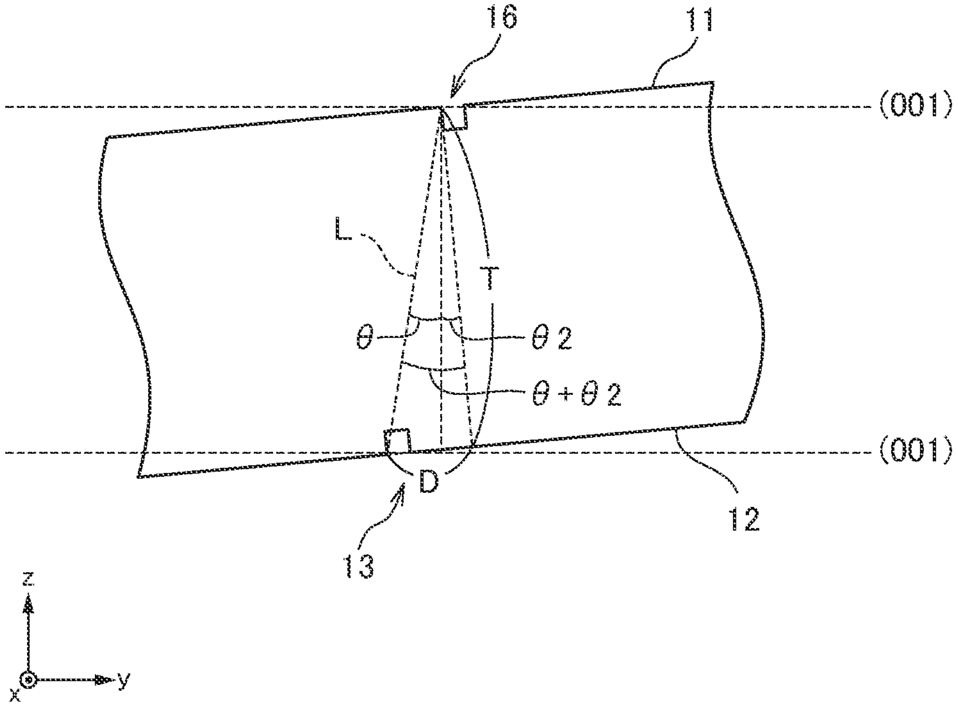
FIG. 6 is a schematic perspective view showing an example in which the element forming surface 11 of the β-type gallium oxide substrate is offset with respect to the (001) plane.

In such a case, as illustrated in FIG. 6, when the offset angle of the (001) plane with respect to the y-axis is θ2, the distance D is T×tan (θ+θ2).

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST

10 β-type gallium oxide substrate
11 element forming surface
12 back surface
13, 16 dividing groove
14 dicing line
15 cleavage surface
20 element

What is claimed is:

1. A method of dividing a β-type gallium oxide substrate, the method comprising:

a step of forming a plurality of first dividing grooves along an extending direction of a (100) plane of a β-type gallium oxide substrate having a (001) plane as a main surface;

a step of processing the β-type gallium oxide substrate into strips by cutting the β-type gallium oxide substrate along a direction perpendicular to an extending direction of the first dividing grooves in a plan view from a direction perpendicular to the main surface of the β-type gallium oxide substrate; and a step of cleaving the strip-shaped β-type gallium oxide substrates along the first dividing grooves for singulation.

2. The method of dividing a β-type gallium oxide substrate as claimed in claim 1, wherein the first dividing grooves are formed by etching.

3. The method of dividing a β-type gallium oxide substrate as claimed in claim 1, wherein the first dividing grooves are formed on a back surface located on a side opposite to an element forming surface.

4. The method of dividing a β-type gallium oxide substrate as claimed in claim 3, further comprising a step of forming a plurality of second dividing grooves in the element forming surface along the extending direction of the (100) plane, wherein a straight line connecting the first and second dividing grooves have an angle of about 76° with respect to the element forming surface.

5. The method of dividing a β-type gallium oxide substrate as claimed in claim 2, wherein the first dividing grooves are formed on a back surface located on a side opposite to an element forming surface.

6. A method of singulating a β-type gallium oxide substrate, the β-type gallium oxide substrate having an element forming surface, a back surface opposite to the element forming surface, and a (001) plane as one of the element forming surface and the back surface, the method comprising:

forming a plurality of first dividing grooves on either the element forming surface or the back surface, the first dividing grooves extending parallel to an intersection line between a (100) plane and the (001) plane;

after forming the plurality of first dividing grooves, cutting the β-type gallium oxide substrate into strips in a direction perpendicular to the first dividing grooves; and after cutting the β-type gallium oxide substrate into strips, cleaving the strips along the first dividing grooves to singulate the β-type gallium oxide substrate.

7. The method of claim 6, wherein the first dividing grooves are formed by etching.

8. The method of claim 6, wherein the first dividing grooves are formed on the back surface.

9. The method of claim 7, wherein the first dividing grooves are formed on the back surface.

10. The method of claim 8, further comprising forming a plurality of second dividing grooves in the element forming surface, the second dividing grooves extending parallel to the intersection line between the (100) plane and the (001) plane, wherein a straight line connecting one of the first dividing grooves and one of the second dividing grooves is inclined relative to the element forming surface by about 76°.

* * * * *